United States Patent
Hong et al.

(10) Patent No.: US 9,756,723 B2
(45) Date of Patent: Sep. 5, 2017

(54) STRETCHABLE DISPLAY AND MANUFACTURING METHOD THEREOF

(71) Applicant: SAMSUNG DISPLAY CO., LTD., Yongin, Gyeonggi-Do (KR)

(72) Inventors: Jong Ho Hong, Yongin-si (KR); Hye Jin Joo, Suwon-si (KR); Won Il Choi, Ansan-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 226 days.

(21) Appl. No.: 14/801,877

(22) Filed: Jul. 17, 2015

(65) Prior Publication Data

US 2016/0198567 A1    Jul. 7, 2016

(30) Foreign Application Priority Data

Jan. 6, 2015  (KR) .................. 10-2015-0001403

(51) Int. Cl.
| | | |
|---|---|---|
| *H01J 1/62* | (2006.01) | |
| *H05K 1/02* | (2006.01) | |
| *G06F 3/041* | (2006.01) | |
| *H05K 3/30* | (2006.01) | |

(52) U.S. Cl.
CPC ......... *H05K 1/0283* (2013.01); *G06F 3/0412* (2013.01); *G06F 2203/04102* (2013.01); *G06F 2203/04103* (2013.01); *H05K 3/305* (2013.01); *H05K 2201/09045* (2013.01); *H05K 2201/10106* (2013.01)

(58) Field of Classification Search
CPC ......... G06F 3/0412; G06F 2203/04103; G06F 2203/04102; H05K 3/305; H05K 2201/09045

USPC .......................................... 313/511, 498, 506
See application file for complete search history.

(56) References Cited

U.S. PATENT DOCUMENTS

| | | |
|---|---|---|
| 7,268,491 B2 | 9/2007 | Aksamit et al. |
| 8,207,473 B2 | 6/2012 | Axisa et al. |
| 8,217,381 B2 | 7/2012 | Rogers et al. |
| 8,389,862 B2 | 3/2013 | Arora et al. |
| 8,536,667 B2 | 9/2013 | De Graff et al. |
| 8,552,299 B2 | 10/2013 | Rogers et al. |
| 2012/0052268 A1 | 3/2012 | Axisa et al. |
| 2013/0058063 A1 | 3/2013 | O'Brien |

OTHER PUBLICATIONS

Young Min Song, et al., "Digital Cameras With Designs Inspired by the Arthropod Eye", Letter Research, doi: 10.1038/nature 12083, May 2, 2013, vol. 497, pp. 95-99.

Sangwoo Kim, et al., "Negatively Strain-Dependent Electrical Resistance of Magnetically Arranged Nickel Composites: Application to Highly Stretchable Electrodes and Stretchable Lighting Devices", Advanced Materials 2014, 26, wileyonlinelibrary.com, pp. 3094-3099.

*Primary Examiner* — Vip Patel
(74) *Attorney, Agent, or Firm* — Lee & Morse P.C.

(57) ABSTRACT

A stretchable display includes a stretchable substrate including a flat part and a plurality of protrusions protruding above the flat part, a plurality of fixed light emitting devices, each fixed light emitting device being attached to an upper surface of a corresponding protrusion of the plurality of protrusions, a plurality of moving light emitting devices, the moving light emitting devices being positioned among the plurality of protrusions, and a plurality of connection wirings connecting among the plurality of fixed light emitting devices and the plurality of moving light emitting devices.

20 Claims, 22 Drawing Sheets

STRETCHABLE DISPLAY AND MANUFACTURING METHOD THEREOF

CROSS-REFERENCE TO RELATED APPLICATION

Korean Patent Application No. 10-2015-0001403, filed on Jan. 6, 2015, in the Korean Intellectual Property Office, and entitled: "Stretchable Display and Manufacturing Method Thereof," is incorporated by reference herein in its entirety.

BACKGROUND

1. Field

The present disclosure relates to a stretchable display and a manufacturing method thereof.

2. Description of the Related Art

A stretchable display is a kind of next-generation display device whose panel size may be increased, e.g., expanded. A conventional stretchable display has a flexible panel with a hidden portion, so the hidden portion may be expanded, if necessary, to be revealed to a user.

SUMMARY

The present disclosure provides a stretchable display with high resolution and a manufacturing method thereof.

An exemplary embodiment provides a stretchable display, including a stretchable substrate including a flat part and a plurality of protrusions protruding above the flat part, a plurality of fixed light emitting devices, each fixed light emitting device being attached to an upper surface of a corresponding protrusion of the plurality of protrusions, a plurality of moving light emitting devices, the moving light emitting devices being positioned among the plurality of protrusions, and a plurality of connection wirings connecting among the plurality of fixed light emitting devices and the plurality of moving light emitting devices.

The moving light emitting devices may include first moving light emitting devices positioned on the flat part and second moving light emitting devices positioned between respective first moving light emitting devices and fixed light emitting devices.

Lateral sides of each protrusion may be positively tapered toward an upper surface of the flat part, the second moving light emitting devices extending along respective lateral sides of the protrusions.

The second moving light emitting devices may be horizontal only when the stretchable substrate is elongated.

Lateral sides of the protrusion may be reversely tapered toward an upper surface of the flat part.

The first moving light emitting device and the second moving light emitting device may emit light only in the state in which the stretchable substrate is elongated.

The moving light emitting devices may emit light when the stretchable substrate is contracted.

The stretchable display may further include an adhesive layer between the protrusions and the fixed light emitting devices.

Each of the fixed light emitting devices and the moving light emitting devices may include a support layer, a display layer on the support layer, and an encapsulating layer covering the display layer.

The connection wiring may include a metal line and a flexible polymer enclosing the metal line.

The stretchable substrate may be stretchable in a first direction.

The stretchable substrate may be simultaneously stretchable in a first direction and in a second direction orthogonal to the first direction.

The stretchable display may further include a stretchable cover plate positioned on the fixed light emitting device, a stretchable touch panel on the stretchable cover plate, and a stretchable window on the stretchable touch panel.

Another exemplary embodiment provides a stretchable display, including a stretchable substrate, a plurality of fixed light emitting devices attached to the stretchable substrate, a plurality of moving light emitting devices positioned over the stretchable substrate, while being spaced apart from the stretchable substrate, and a plurality of connection wirings connecting the plurality of fixed light emitting devices and the plurality of moving light emitting devices.

At least one of the plurality of moving light emitting devices may not emit light when the stretchable substrate is contracted.

The stretchable display may further include a stretchable cover plate over the fixed light emitting device and the moving light emitting device, a spacer positioned between each of the fixed light emitting devices and the stretchable cover plate, the spacer maintaining an interval between the fixed light emitting device and the stretchable cover plate, a stretchable touch panel on the stretchable cover plate, and a stretchable window on the stretchable touch panel.

The stretchable display may further include an adhesive layer between the stretchable substrate and the fixed light emitting device.

Another exemplary embodiment provides a manufacturing method of a stretchable substrate, including forming a plurality of light emitting devices and a plurality of connection wirings connecting therebetween on a carrier substrate, separating the plurality of light emitting devices and the plurality of connection wirings from the carrier substrate, forming a stretchable substrate including a plurality of protrusions protruding above a flat part of the stretchable substrate, elongating the stretchable substrate to increase intervals among the plurality of protrusions, attaching the plurality of light emitting devices and the plurality of connection wirings to the elongated stretchable substrate, and contracting the stretchable substrate.

Forming the plurality of light emitting devices may include attaching a plurality of fixed light emitting devices to the protrusions, and forming a plurality of moving light emitting devices between the protrusions.

The method may further include positioning a stretchable cover plate above the light emitting devices when the stretchable substrate is in contracted state, forming a stretchable touch panel on the stretchable cover plate, and forming a stretchable window on the stretchable touch panel.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
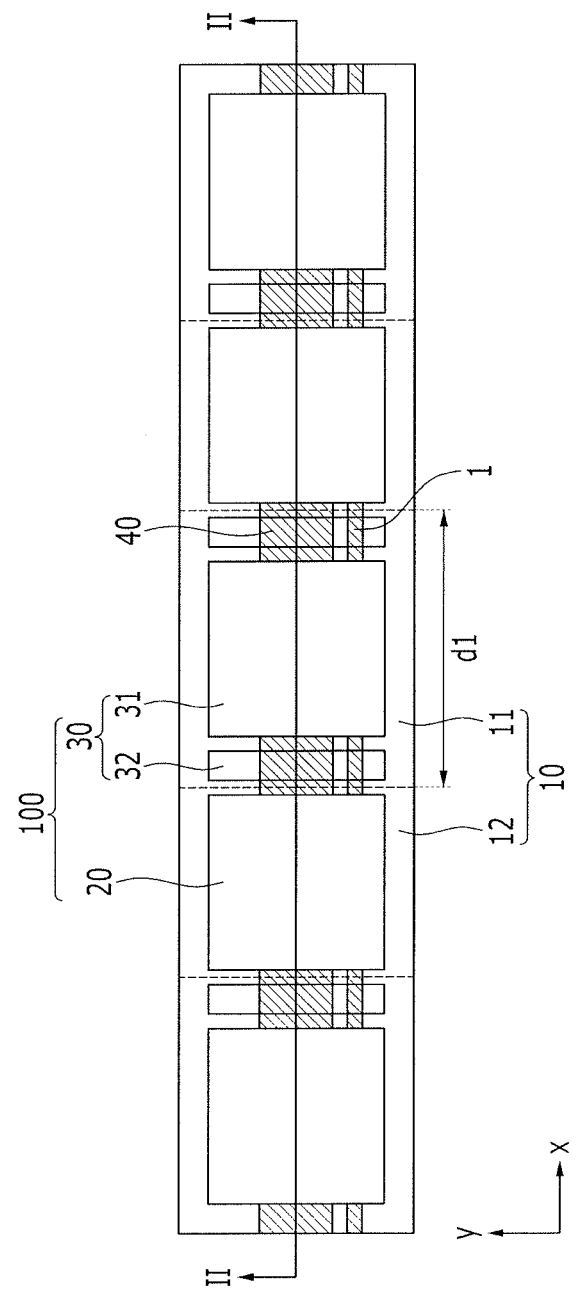
FIG. 1 illustrates a plan view of a stretchable display according to an exemplary embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Throughout the present specification, unless explicitly described to the contrary, "comprising" any components will be understood to imply the inclusion of other elements. Further, throughout the present specification, it will be understood that when an element such as a layer, a film, a region, or a substrate is referred to as being "on" another element, it may be directly on another element or may have an intervening element present therebetween. Further, "~on" or "~over" mean that an element is over or under an object portion and does not mean that an element is necessarily positioned over an upper portion based on a gravity direction.

Next, a stretchable display according to an exemplary embodiment of the present disclosure will be described in detail with reference to FIGS. 1 to 3.

Figure 2:
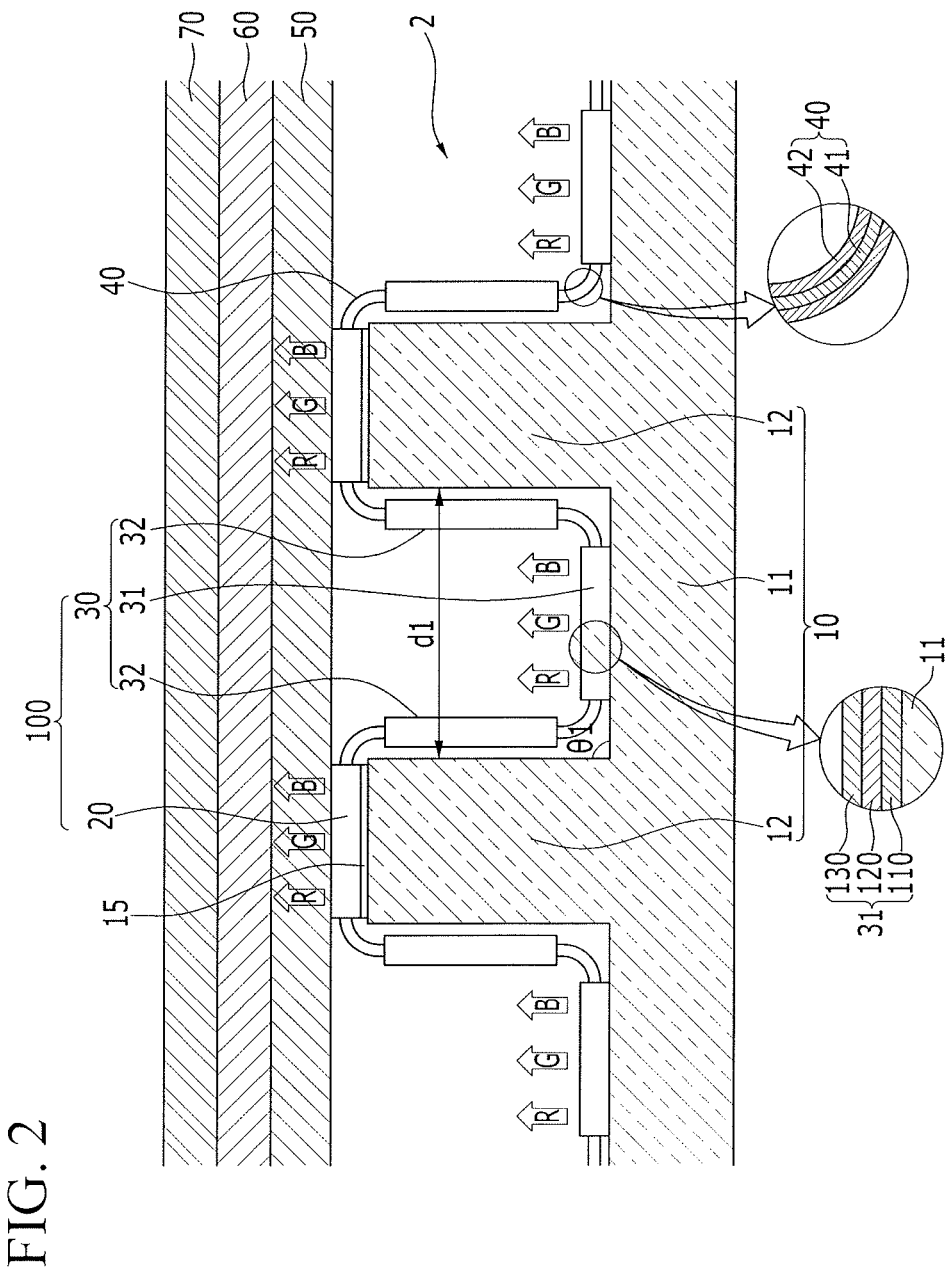
FIG. 2 illustrates a cross-sectional view taken along line II-II of FIG. 1.
Figure 3:
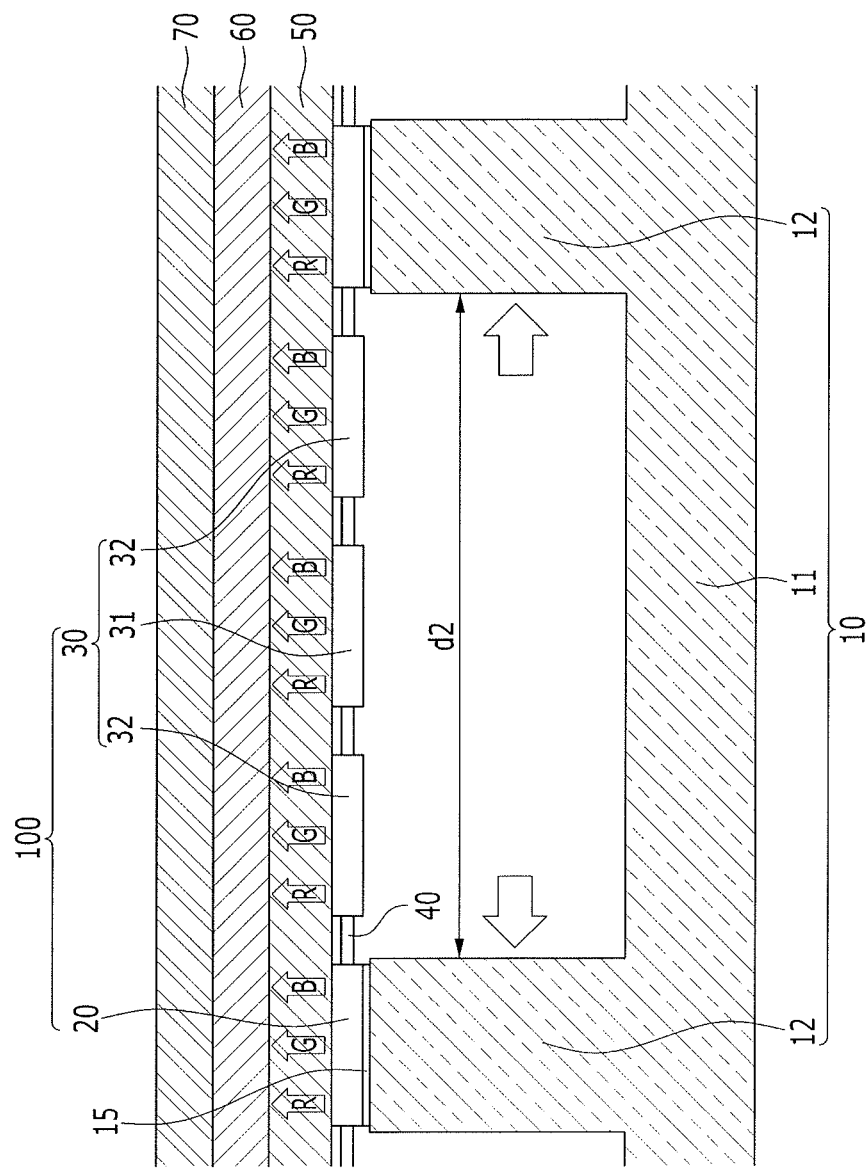
FIG. 3 illustrates a cross-sectional view of a state in which the stretchable display device of FIG. 2 is elongated at an elongation of 100%.

FIG. 1 illustrates a plan view of a stretchable display according to an exemplary embodiment of the present disclosure, FIG. 2 is a cross-sectional view taken along the line II-II of FIG. 1, and FIG. 3 is a cross-sectional view of a state in which the stretchable display device of FIG. 2 is stretched at an elongation of 100%.

Referring to FIGS. 1 and 2, a stretchable display according to an exemplary embodiment of the present disclosure may include a stretchable substrate 10, a plurality of light emitting devices 100 positioned on the stretchable substrate 10, and connection wirings 40 connecting between the plurality of light emitting devices 100.

The stretchable substrate 10 may include a flat plane part 11 and a plurality of protrusions 12 which protrude upward above the plane part 11, e.g., each protrusion 12 may be between two adjacent portions of the flat plane part 11. The protrusions 12 may be spaced apart from each other at a constantly contracted interval d1, i.e., the contracted interval d1 refers to a constant distance between two adjacent protrusions 12 along the x direction when the stretchable substrate 10 is in a contracted state. The stretchable substrate 10 may be made of a stretchable polymer, e.g., a silicone elastomer and/or polyurethane. In this case, the stretchable substrate 10 is stretched only in a first direction x.

The plurality of light emitting devices 100 includes a plurality of fixed light emitting devices 20 and a plurality of moving light emitting devices 30. Each of the fixed light emitting devices 20 is attached to a respective upper surface of the plurality of protrusions 12, and each of the moving light emitting devices 30 is positioned between two adjacent protrusions 12, i.e., each of the moving light emitting devices 30 is positioned on a respective portion of the flat plate part 11.

The fixed light emitting device 20 and the moving light emitting device 30 each include a support layer 110, a display layer 120 formed on the support layer 110, and an encapsulating layer 130 covering the display layer 120. The display layer 120 may include a light emitting structure, e.g., an organic light emitting diode (OLED), a polymer light emitting diode (PLED), a quantum dot (QD), a light emitting diode (LED), and the like. The display layer 120 may implement colors, e.g., red (R), green (G), and blue (B).

An adhesive layer 15 is formed between each of the protrusions 12 and a corresponding fixed light emitting device 20 thereon. When the stretchable substrate 10 is stretched, the adhesive layer 15 bonds the fixed light emitting device 20 to the protrusion 12, so that the fixed light emitting device 20 is fixed to the protrusion 12. The adhesive layer 15 may be formed by forming a silicon oxide layer and performing surface treatment thereon or may be formed as a primer.

The moving light emitting device 30 may include a first moving light emitting device 31 positioned on the plane part 11 and a second moving light emitting device 32 positioned between the first moving light emitting device 31 and the fixed light emitting device 20, e.g., the second moving light emitting device 32 may be on a lateral side of the protrusion 12. In this case, the lateral side of the protrusion 12 may be formed to be positively tapered to an upper surface of the plane part 11. For example, a first inclined angle θ1 between the lateral side of the protrusion 12 and the upper surface of the plane part 11 forms an obtuse angle or a right angle. FIGS. 2 and 3 illustrate a case in which the first inclined angle θ1 is a right angle, but the exemplary embodiment of the present disclosure is not necessarily limited thereto.

A connection wiring 40 includes a metal line 41 and a flexible polymer 42 enclosing the metal line. The metal line 41 may be made of a metal, e.g., gold (Au), silver (Ag), molybdenum (Mo), aluminum (Al), and copper (Cu), which have excellent conductivity, or of a nano material, e.g., a nano wire, a carbon nanotube (CNT), and graphene, which have excellent flexibility and conductivity. The flexible polymer 42 may be made of high heat resistant polymer, e.g., polyimide. For example, as illustrated in FIG. 2, the connection wirings 40 may connected every two adjacent light emitting devices 100, e.g., connect each second moving light emitting device 32 to an adjacent first moving light emitting device 31 and to a fixed light emitting device 20.

As illustrated in FIG. 1, a sensor wiring 1 may be positioned adjacent to the connection wiring 40. Further, the sensor wiring 1 may be spaced apart from the connection wiring 40 along the y-axis direction. The sensor wiring 1 connects between the plurality of light emitting devices 20 and 30 and may include a plurality of sensors (not illustrated) which may sense elongation. The sensor wiring 1 may sense the elongation to control the number of light emitting devices 100 which emit light depending on the elongation and thus may maintain resolution.

A stretchable cover plate 50 is positioned on the fixed light emitting device 20 which is attached to the protrusion 12. The stretchable cover plate 50 covers the fixed light emitting device 20 and the moving light emitting device 30 to protect the fixed light emitting device 20 and the moving light emitting device 30 from the outside. A space 2 between the stretchable cover plate 50 and the stretchable substrate 10 may be filled with air or moisture absorbent. The stretchable cover plate 50 may contact the fixed light emitting device 20. Therefore, to prevent the fixed light emitting device 20 from being damaged, elongation of the stretchable cover plate 50 may be equal to that of the stretchable substrate 10.

A stretchable touch panel 60 is formed on the stretchable cover plate 50. The stretchable touch panel 60 is an input device which is directly touched by a user's hand, a pen, or the like to input an external input signal. A stretchable window 70 is formed on the stretchable touch panel 60 and the stretchable window 70 is to protect the stretchable touch panel 60 from outside physical environment. Elongation of the stretchable touch panel 60 and the stretchable window 70 may be equal to that of the stretchable substrate 10.

Hereinafter, an operation of the stretchable display device according to the exemplary embodiment of the present disclosure will be described with reference to FIGS. 2 and 3.

FIG. 2 illustrates a cross-sectional view of a contracted state of the stretchable display device, i.e., a state before the flexible substrate 10 of the stretchable display device is elongated. FIG. 3 illustrates a cross-sectional view of an elongated state of the stretchable display device, i.e., a state after the stretchable substrate 10 of the stretchable display device is elongated.

As illustrated in FIG. 2, the protrusions 12 which protrude from the stretchable substrate 10 in the contracted state are spaced apart from each other, having a contracted interval d1 therebetween. In this case, the fixed light emitting device 20 is horizontally positioned, being fixed onto the upper surface of the protrusion 12. Further, since no structure for blocking light emitted from the fixed light emitting device 20 is present over the fixed light emitting device 20, the light emitted from the fixed light emitting device 20 is propagated toward a front side of the display device (along arrows in FIG. 2). Further, the first moving light emitting device 31 is horizontally positioned, and since no structure for blocking light emitted from the first moving light emitting device 31 is present over a first moving light emitting device 31, the light emitted from the fixed light emitting device 31 is propagated toward a front side (along arrows in FIG. 2).

However, the second moving light emitting device 32 does not emit light in the contracted state of the stretchable substrate 10.

Next, as illustrated in FIG. 3, in the elongated state, i.e., a stretched state, the stretchable substrate 10 is elongated, e.g., stretched along the x-axis direction, such that a distance between the protrusions 12 along the x-axis direction increases from contracted interval d1 to an elongated interval d2. That is, the elongated interval d2 between adjacent protrusions 12 of the stretchable substrate 10 in an elongated state is larger than the contracted interval d1 between the protrusions 12 of the stretchable substrate 10 in the contracted state. Here, the elongation is defined as ½ of an increasing rate of a distance between adjacent protrusions 12. Therefore, when the elongated interval d2 is three times as large as the contracted interval d1, elongation=(d2−d1)/d1×½×100%=100%.

In this case, the fixed light emitting device 20 is horizontally positioned, being fixed on the protrusion 12, and therefore, the light emitted from the fixed light emitting device 20 is propagated to the front side. Further, in the elongated state, since the moving light emitting device 30 is not affixed to the stretchable substrate 10, the first moving light emitting device 31 moves vertically upwardly to be spaced apart from the plane part 11 by a tensile force. For example, when the stretchable substrate 10 is elongated horizontally to space apart the protrusions 12 by the elongated interval d2, the connection wiring 40 connected to the fixed light emitting devices 20 on the upper surfaces of the protrusions 12 is pulled horizontally along, e.g., and in parallel to, the elongated stretchable substrate 10, thereby pulling by the tensile force the moving light emitting device 30 (which is not affixed to the stretchable substrate 10) into a structure aligned along, e.g., and in parallel to, the elongated stretchable substrate 10, e.g., spaced apart from and in parallel to an upper surface of the plane part 11.

In this case, the first moving light emitting device 31 is still horizontally positioned, and therefore, the light emitted from the first moving light emitting device 31 is propagated toward the front side. Further, in the elongated state, the second moving light emitting device 32 is also horizontally positioned, being spaced apart from the lateral side of the protrusion 12 by the tensile force. Therefore, the light emitted from the second moving light emitting device 32 propagates to the front side, such that the second moving light emitting device 32 emits light. As such, the second moving light emitting device 32 determines, e.g., affects, the amount of light emitted to the front side, i.e., increased emission of light depends on a stretched state of the stretchable substrate 10. Accordingly, the stretchable display according to an exemplary embodiment is also called a hidden light emitting device.

As such, when the stretchable substrate 10 is elongated, the number of light emitting devices 100 which emit light is increased. Therefore, even when the stretchable substrate 10 is elongated, the resolution does not deteriorate. Further, it is possible to make the resolution uniform on the whole by increasing the number of light emitting devices which emits light depending on the elongation.

Meanwhile, when the stretchable substrate 10 is elongated, the position of the moving light emitting device 30 is changed, and therefore, the stretchable substrate 10 is present in a middle region between an outside and an inside of the stretchable display device and a neutral plane (NP), i.e., where any force is not generated, is changed. In this case, the moving light emitting device 30 is positioned at the neutral plane by controlling the connection wiring 40, and thus, it is possible to prevent screen abnormality of the stretchable display device in the elongated state.

A manufacturing method of a stretchable display device according to the exemplary embodiment of the present disclosure will be described below in detail with reference to FIGS. 4 to 9.

FIGS. 4 to 9 illustrate cross-sectional views of stages in a manufacturing method of a stretchable display device according to an exemplary embodiment of the present disclosure.

Figure 4:
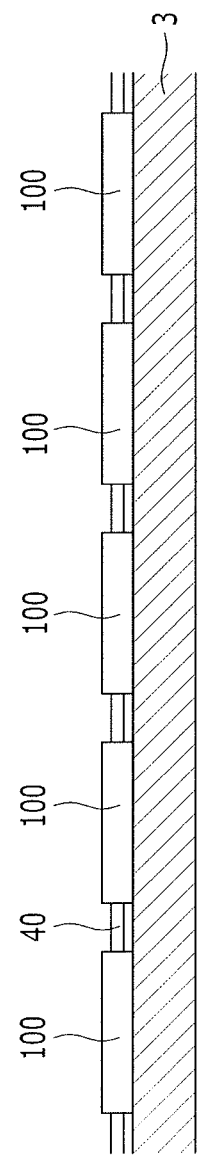
FIGS. 4 to 9 illustrate cross-sectional views of stages in a manufacturing method of a stretchable display device according to an exemplary embodiment of the present disclosure.

First, as illustrated in FIG. 4, the plurality of light emitting devices 100 and the plurality of connection wirings 40 connecting therebetween are formed on a carrier substrate 3. The plurality of light emitting devices 100 may include a light emitting structure, e.g., an organic light emitting diode (OLED), a polymer light emitting diode (PLED), a quantum dot (QD), and a light emitting diode (LED).

Figure 5:
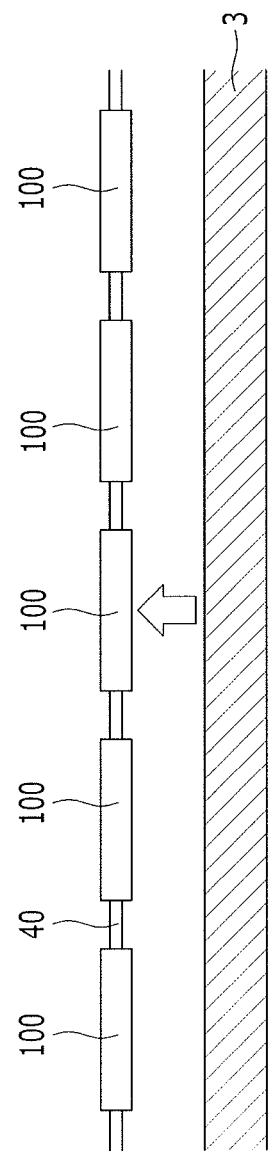

Next, as illustrated in FIG. 5, the plurality of light emitting devices 100 and the plurality of connection wirings 40 are separated from the carrier substrate 3 using a laser lift off.

Figure 6:
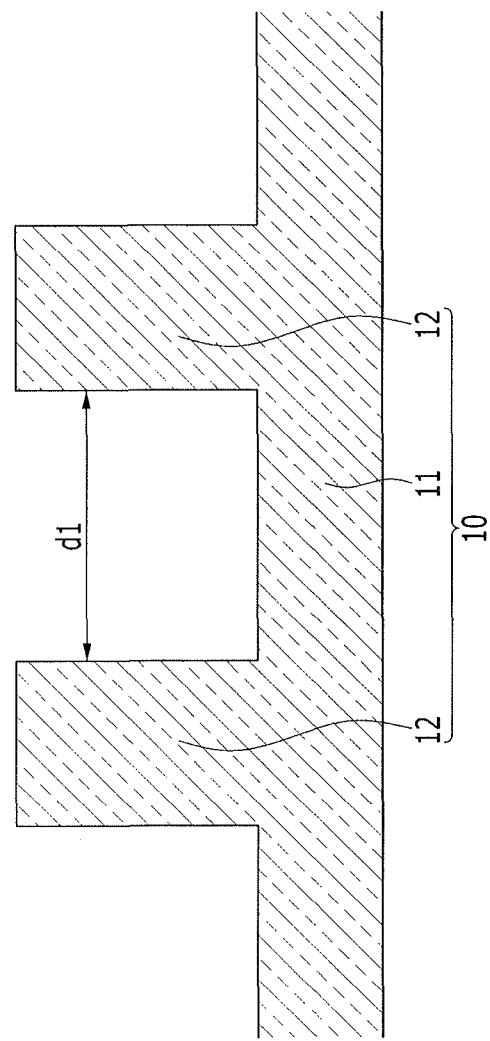

Next, as illustrated in FIG. 6, the stretchable substrate 10 including the plurality of protrusions 12 protruding above the plane part 11 is formed. In this case, the contracted interval d1 is formed between the adjacent protrusions 12.

Figure 7:
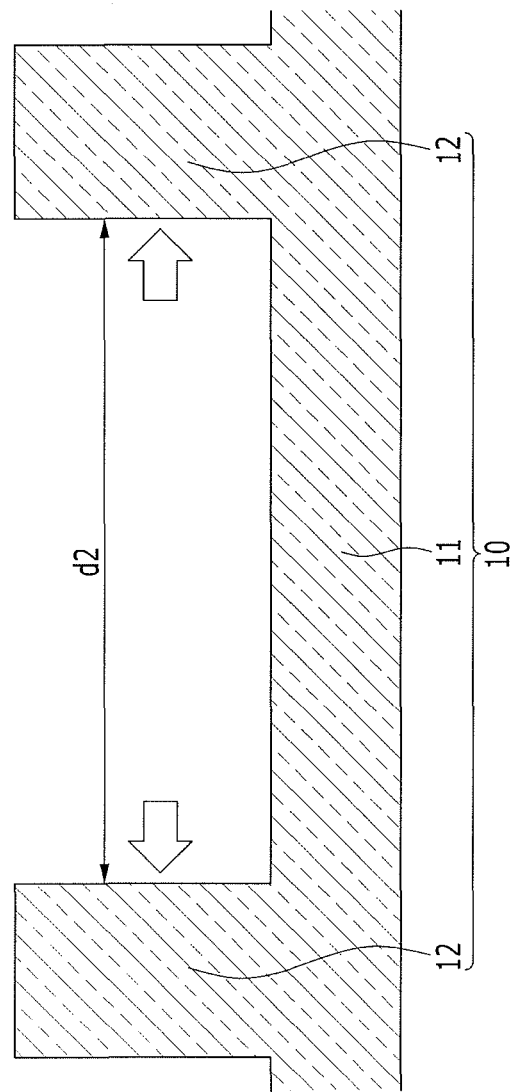

Next, as illustrated in FIG. 7, a distance between the plurality of protrusions 12 is increased by elongating the stretchable substrate 10 to determined, e.g., set, the elongated interval d2. In this case, the elongated interval d2 between the protrusions is larger than the contracted interval d1.

Figure 8:
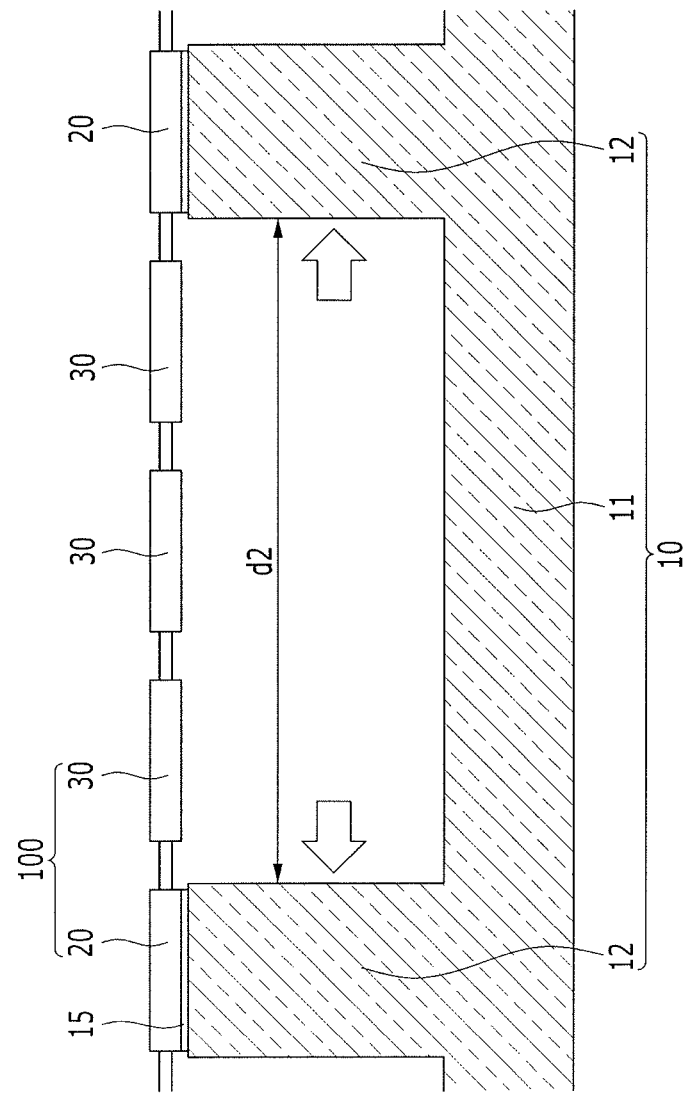

Next, as illustrated in FIG. 8, the plurality of light emitting devices 100 and the plurality of connection wirings 40 are attached to the elongated stretchable substrate 10. In this case, the fixed light emitting devices 20, i.e., which are the plurality of light emitting devices 100 attached to the protrusion 12, are attached to the protrusions 12 via the adhesive layer 15, while the moving light emitting devices 30 are stretched between the protrusions 12 by a tensile force along the elongated stretchable substrate 10. Therefore, the plurality of light emitting devices 100 are separated into the fixed light emitting device 20 which are attached to the upper surface of the protrusion 12 and the moving light emitting devices 30 which are positioned between the protrusions 12.

Figure 9:
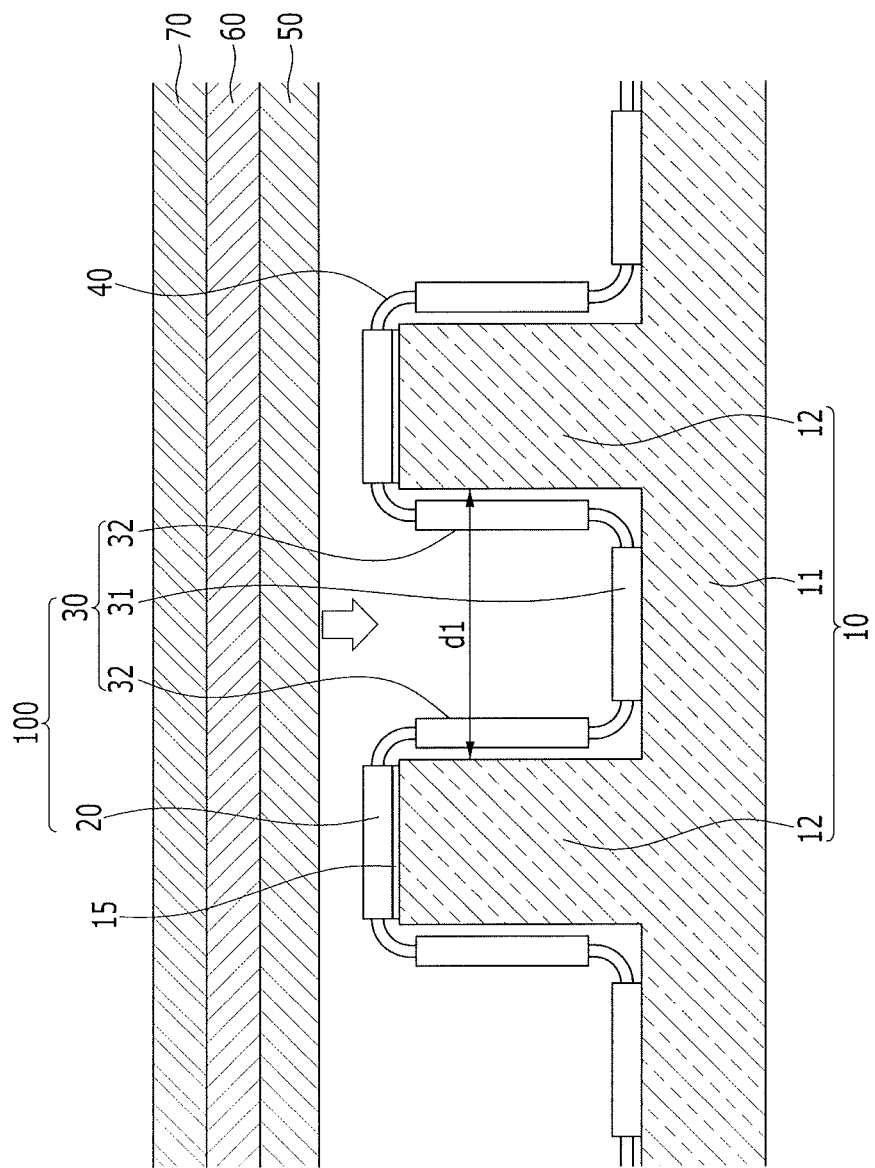

Next, as illustrated in FIG. 9, the stretchable substrate 10 is contracted, and thus, the interval between the protrusions 12 is again contracted to the contracted interval d1. In this case, the second moving light emitting devices 32, which are some of the moving light emitting devices 30, are positioned along the lateral sides of the protrusions 12, and the first moving light emitting devices 31, which are the remaining of the moving light emitting devices 30, are positioned on the plane part 11 between the protrusions 12. The second moving light emitting device 32, which is positioned along the lateral side of the protrusion 12, determines the amount of light emitted to the front side of the display device in accordance with the elongated/contracted state of the stretchable substrate 10, and therefore, is also called the hidden light emitting device.

Further, as illustrated in FIG. 9, the stretchable cover plate 50 is positioned on the fixed light emitting device 20 which is attached to the protrusion 12 of the contracted stretchable substrate 10. Further, the stretchable touch panel 60 is formed on the stretchable cover plate 50, and the stretchable window 70 is formed on the stretchable touch panel 60.

Meanwhile, according to the exemplary embodiment of the present disclosure, the lateral side of the protrusion 12 is formed to be positively tapered to the upper surface of the plane part 11. However, embodiments are not limited thereto, e.g., the lateral side of the protrusion 12 may be formed to be reversely tapered to the upper surface of the plane part 11.

Hereinafter, a stretchable display device according to another exemplary embodiment of the present disclosure will be described in detail with reference to FIGS. 10-11.

Figure 10:
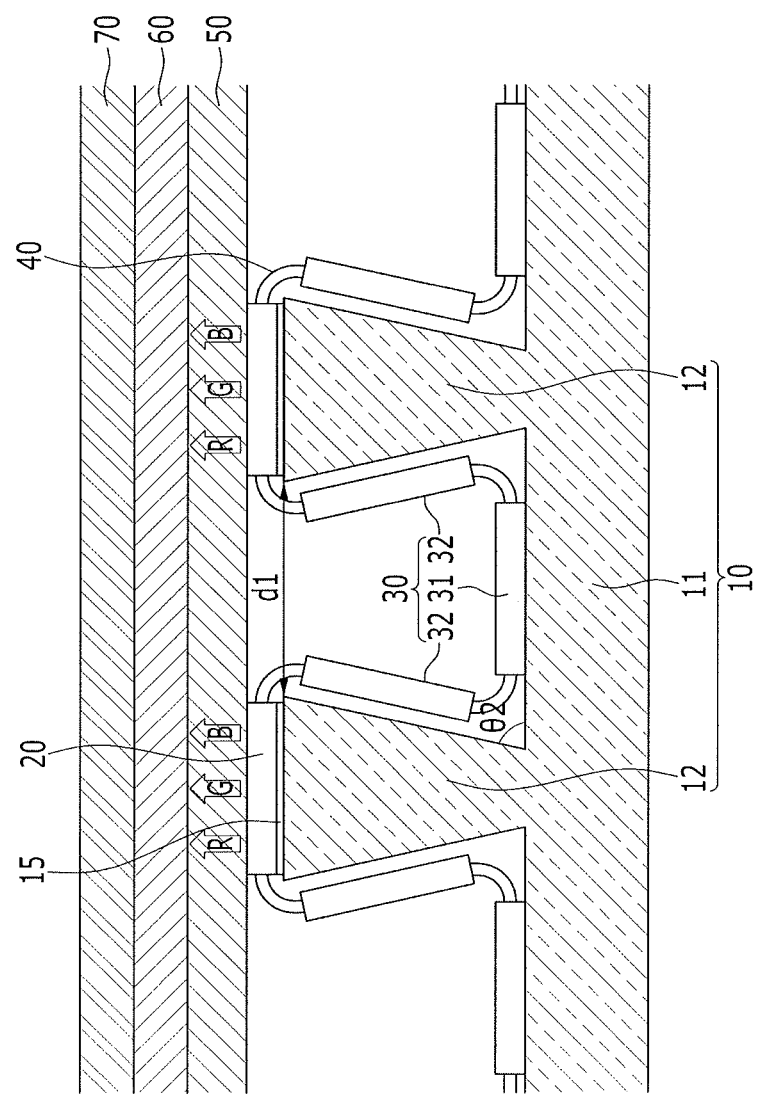
FIG. 10 illustrates a cross-sectional view of a stretchable display according to another exemplary embodiment of the present disclosure.

FIG. 10 illustrates a cross-sectional view of a stretchable display device according to another exemplary embodiment of the present disclosure. FIG. 11 is a cross-sectional view of a state in which the stretchable display device of FIG. 10 is elongated at an elongation of 300%. The exemplary embodiment in FIGS. 10-11 is substantially the same as the exemplary embodiment described previously with reference to FIGS. 1-3, except that the lateral side of the protrusion is reversely tapered to the upper surface of the plane part, and therefore detailed repeated descriptions will be omitted.

Figure 11:
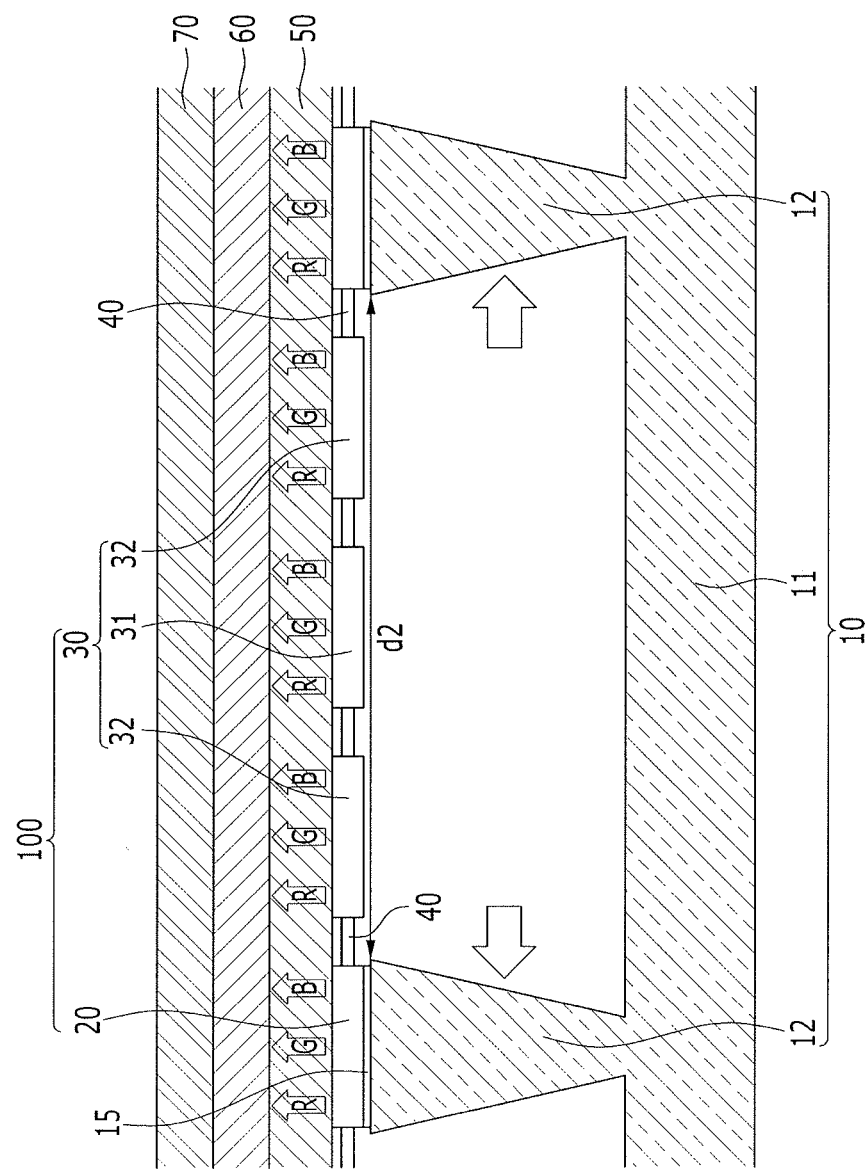
FIG. 11 illustrates a cross-sectional view of a state in which the stretchable display of FIG. 10 is elongated at an elongation of 300%.

As illustrated in FIGS. 10 and 11, the moving light emitting device 30 of the stretchable display device includes the first moving light emitting device 31, which is positioned on the plane part 11, and the second moving light emitting device 32, which is positioned between the first moving light emitting device 31 and the fixed light emitting device 20. In this case, the lateral side of the protrusion 12 is formed to be reversely tapered to the upper surface of the plane part 11. Therefore, a second inclined angle θ2 between the lateral side of the protrusion 12 and the upper surface of the plane part 11 forms an acute angle. The second moving light emitting device 32 is inclined along the side of the reversely taped protrusion 12.

In detail, as illustrated in FIG. 10, the protrusions 12 of the stretchable substrate 10 in the contracted state are spaced apart from each other, being spaced apart by the contracted interval d1. In this case, the fixed light emitting device 20 is horizontally positioned, being fixed on the protrusion 12. Since no structure for blocking light emitted from the fixed light emitting device 20 is present over the fixed light emitting device 20, the light emitted from the fixed light emitting device 20 is propagated toward the front side of the display device.

The first moving light emitting device 31 is horizontally positioned on the plane part 11. However, since the second moving light emitting device 32 extends along the reversely inclined lateral sides of the protrusions 12, it is inclined over the first moving light emitting device 31. As such, the second moving light emitting device 32 blocks at least part of the light emitted from the first moving light emitting device 31, e.g., blocks a majority of the light emitted from the fixed light emitting device 31, thereby reducing the amount of light propagated toward the front side of the display device in the contracted state of the stretchable substrate 10.

Therefore, the first moving light emitting device 31 may not emit light in the contracted state of the stretchable substrate 10. Further, the second moving light emitting device 32 is positioned to be inclined along the lateral side of the protrusion 12 reversely tapered, and therefore, light emitted from the second moving light emitting device 32 is hardly propagated toward the front side. Therefore, the second moving light emitting device 32 does not emit light in the contracted state of the stretchable substrate 10.

Next, as illustrated in FIG. 11, in the elongated state in which both of the first moving light emitting device 31 and the second moving light emitting device 32 are horizontally positioned, the elongated interval d2 between the protrusions 12 of the stretchable substrate 10 is larger than the contracted interval d1 between the protrusions 12 of the stretchable substrate 10 in the contracted state. Here, the elongation is defined as ½ of the increasing rate of a distance between the protrusions 12 and the elongated interval d2 is seven times as large as the contracted interval d1, and therefore, the elongation=(d2−d1)/d1×100/2=300%.

In this case, the fixed light emitting device 20 is horizontally positioned, being fixed on the protrusion 12. Therefore, the light emitted from the fixed light emitting device 20 is propagated to the front side. Further, in the elongated state, the first moving light emitting device 31 moves vertically upwardly, being spaced apart from the plane part 11 by a tensile force. In this case, the second moving light emitting device 32 is not positioned over the first moving light emitting device 31, but the first moving light emitting device 31 is horizontally positioned. Therefore, the light emitted from the first moving light emitting device 31 is propagated toward the front side.

Further, in the elongated state, the second moving light emitting device 32 is horizontally positioned, being spaced apart from the side of the protrusion 12 by a tensile force. Therefore, the light emitted from the second moving light emitting device 32 may be propagated to the front side, such that the second moving light emitting device 32 emits light.

Therefore, the first moving light emitting device 31 and the second moving light emitting device 32 of the stretchable display device according to the present exemplary embodiment emit light that propagates toward the front side of the display device only in the state in which the stretchable substrate 10 is elongated. As such, when the stretchable substrate 10 is elongated, the number of light emitting devices 100 that emit light that propagates toward the front side is increased, and therefore, even when the stretchable substrate 10 is elongated, the resolution does not deteriorate. Further, it is possible to make the resolution uniform on the whole by increasing the number of light emitting devices which emit light in accordance with the elongation. Further, the lateral side of the protrusion is formed to be reversely tapered to the upper surface of the plane part, and therefore, according to the exemplary embodiment of the present disclosure, the elongation may be further improved by up to 300%, e.g., as compared to a lateral side of the protrusion that is positively tapered to the upper surface of the plane part.

Meanwhile, according to the exemplary embodiment of the present disclosure in FIGS. 1-11, only some light of the moving light emitting devices was emitted toward the front side in a contracted state. However, embodiments are not limited thereto, e.g., all the moving light emitting devices may emit light that propagates toward the front side in the contracted state.

Hereinafter, a stretchable display device according to another exemplary embodiment of the present disclosure will be described in detail with reference to FIGS. 12 and 13.

Figure 12:
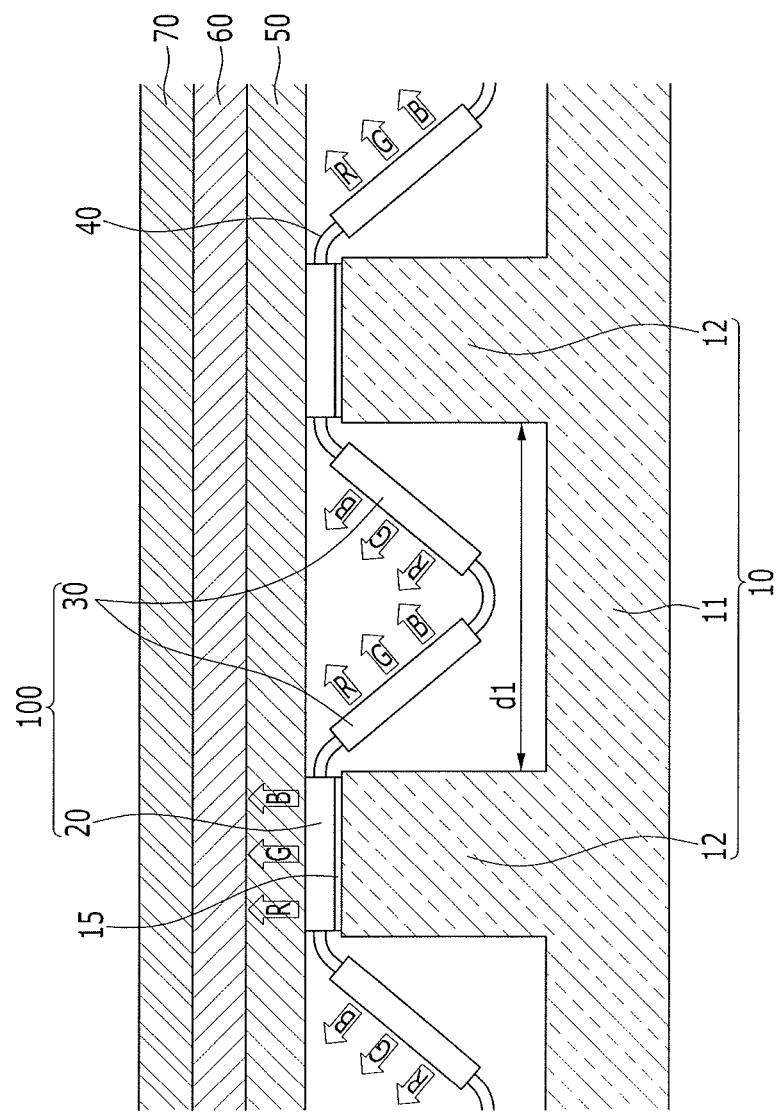
FIG. 12 illustrates a cross-sectional view of a stretchable display according to yet another exemplary embodiment of the present disclosure.

FIG. 12 illustrates a cross-sectional view of a stretchable display according to yet another exemplary embodiment. FIG. 13 is a cross-sectional view of the state in which the stretchable display of FIG. 12 is elongated at an elongation of 50%. The exemplary embodiment in FIGS. 12 and 13 is substantially the same as the exemplary embodiment in FIGS. 1-3, except that all the moving light emitting devices emit light in the contracted state, and therefore, a detailed repeated description thereof will be omitted.

As illustrated in FIG. 12, the plurality of moving light emitting devices 30 of the stretchable display device may be positioned between the plurality of fixed light emitting devices 20 which are each attached to the upper surfaces of the protrusions 12. The protrusions 12 of the stretchable substrate 10 in the contracted state are spaced apart from each other by the contracted interval d1. In this case, the fixed light emitting devices 20 are horizontally positioned while being fixed on the protrusion 12 and, therefore, emit light toward the front side.

Further, the moving light emitting devices 30 are inclined with respect to the protrusions 12, while being spaced apart from the plane part 11 and the lateral side of the protrusion 12. For example, as illustrated in FIG. 12, the moving light emitting devices 30, e.g., two moving light emitting devices 30, may be supported by the connection wirings 40 between two adjacent protrusions 12 at an oblique angle with respect to the protrusions 12 e.g., without directly contacting the stretchable substrate 10. Therefore, as the light emitted from the moving light emitting devices 30 is angled, e.g., inclined, it only partially propagates toward the front side. In this case, side light characteristics such as a viewing light are improved.

Figure 13:
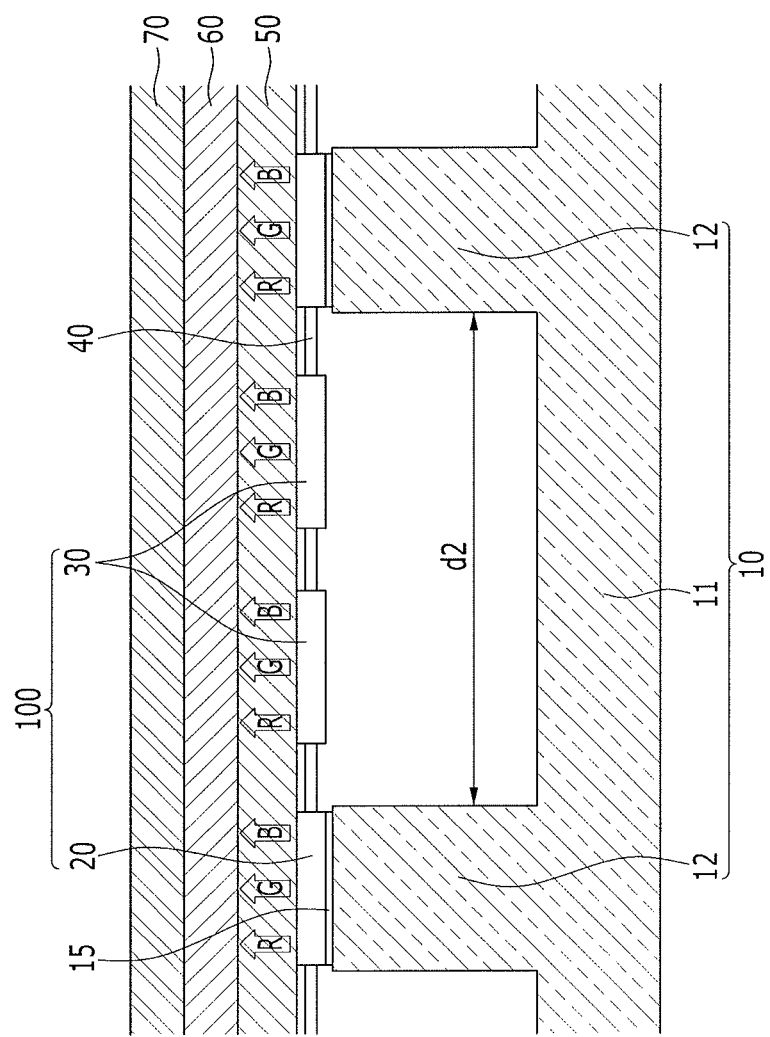
FIG. 13 illustrates a cross-sectional view of the state in which the stretchable display of FIG. 12 is elongated at an elongation of 50%.

Next, as illustrated in FIG. 13, in the elongated state in which all the moving light emitting devices 30 are horizontally positioned, the elongated interval d2 between the protrusions 12 of the stretchable substrate 10 is larger than the contracted interval d1 between the protrusions 12 of the stretchable substrate 10 in the contracted state. Here, the elongation is defined as ½ of an increasing rate of a distance between the protrusions 12, and the elongated interval d2 is two times as large as the contracted interval d1 and, therefore, the elongation=(d2−d1)/d1×100/2=50%.

In this case, the fixed light emitting device 20 emits light toward the front side in the elongated state in a same way as in the contracted state. Further, the moving light emitting device 30 changes position from an inclined, e.g., angled, position with respect to the protrusions 12 in a contracted state into a horizontal, e.g., perpendicular, position with respect to the protrusions 12 by the tensile force in an elongated state, thereby increasing an amount of light emitted toward the front side. However, the moving light emitting devices 30 emit light toward the front side both in the contracted and elongated states. As such, the elongation of the stretchable substrate 10 is controlled to elongate or contract the stretchable substrate 10, thereby controlling the viewing angle.

Meanwhile, according to the exemplary embodiment of the present disclosure in FIGS. 1-13, the stretchable substrate is stretched only in one direction. However, example embodiments are not limited thereto, e.g., the stretchable substrate may be stretched in two intersecting direction.

Hereinafter, a stretchable display device according to another exemplary embodiment will be described in detail with reference to FIGS. 14 to 17.

Figure 14:
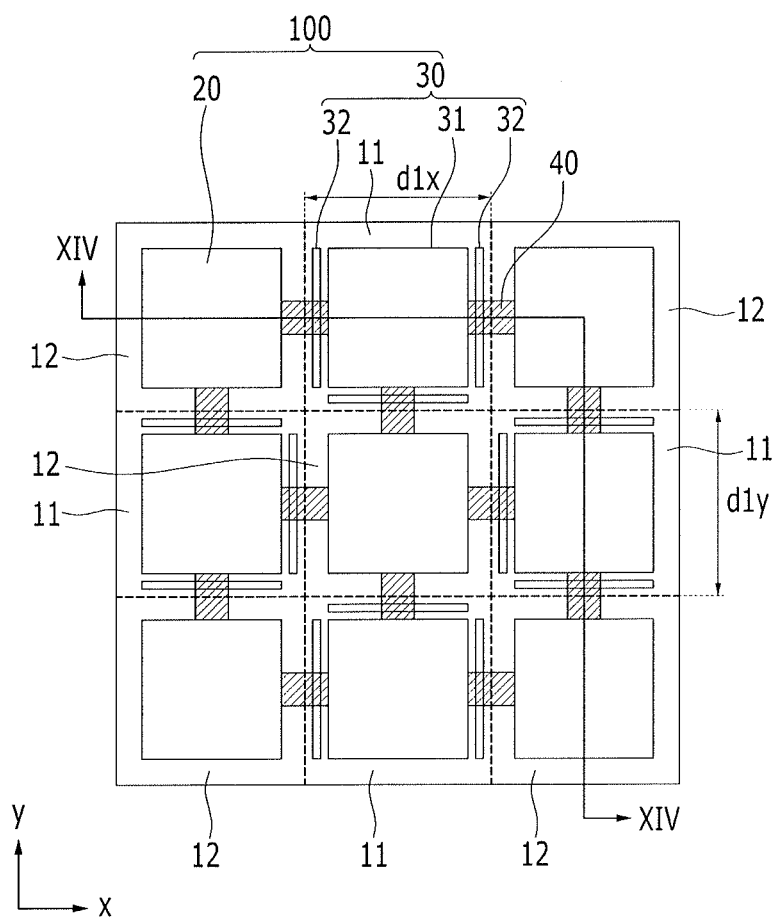
FIG. 14 illustrates a plan view of a stretchable display according to another exemplary embodiment of the present disclosure.
Figure 15:
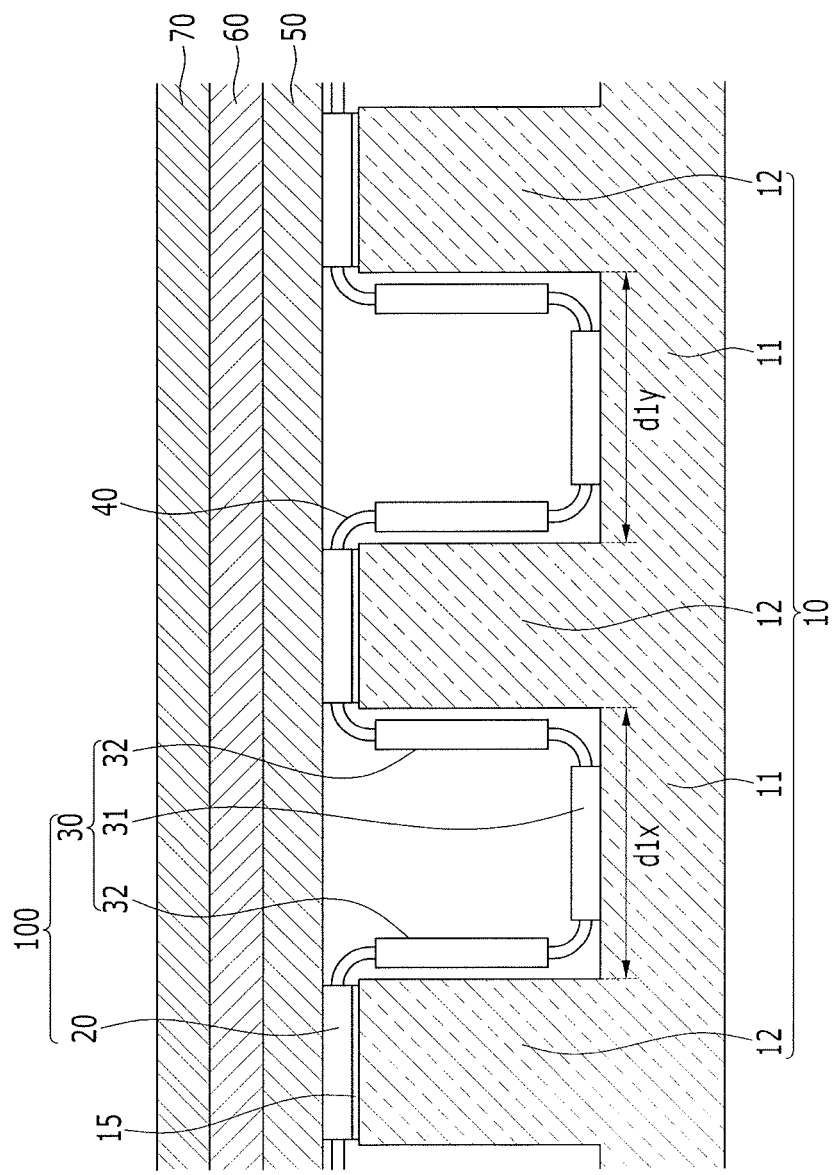
FIG. 15 illustrates a cross-sectional view taken along line XV-XV of FIG. 14.
Figure 16:
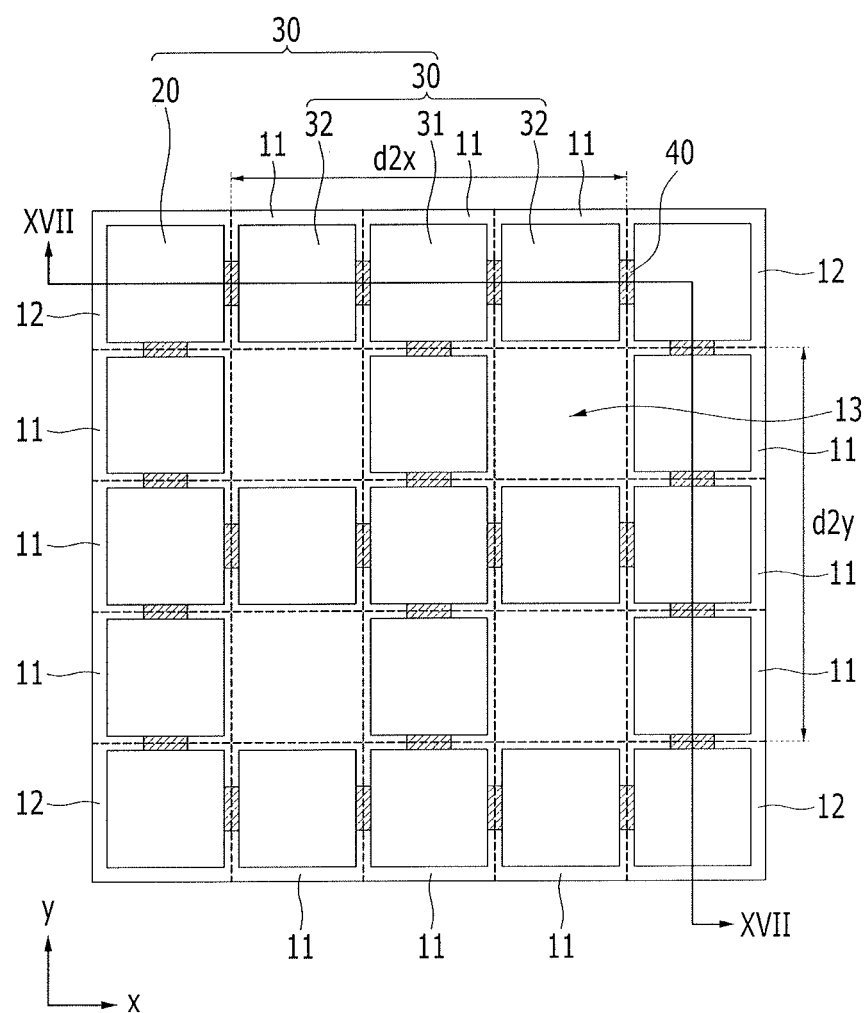
FIG. 16 illustrates a plan view of a state in which the stretchable display device of FIG. 14 is elongated at an elongation of 100%.
Figure 17:
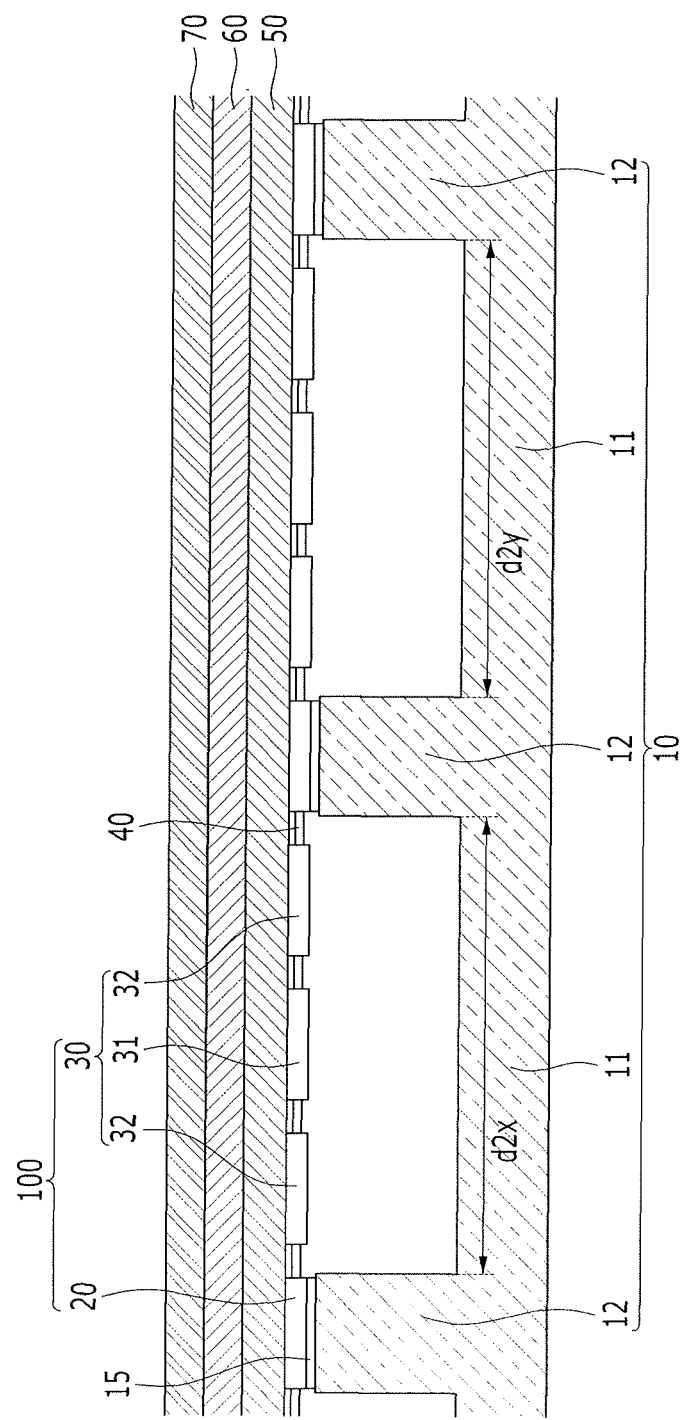
FIG. 17 illustrates a cross-sectional view taken along line XVII-XVII of FIG. 16.

FIG. 14 illustrates a plan view of a stretchable display according to another exemplary embodiment of the present disclosure, and FIG. 15 is a cross-sectional view taken along line XV-XV of FIG. 14. FIG. 16 is a plan view of a state in which the stretchable display device of FIG. 14 is elongated at an elongation of 100%, and FIG. 17 is a cross-sectional view taken along line XVII-XVII of FIG. 16. The exemplary embodiment in FIGS. 14 to 17 is substantially the same as the exemplary embodiment in FIGS. 1-3, except that the stretchable substrate may be stretched in two intersecting directions, and therefore a detailed repeated description thereof will be omitted.

As illustrated in FIGS. 14 and 15, the stretchable substrate 10 according to another exemplary embodiment includes the plane part 11 and the plurality of protrusions 12 protruding above the plane part 11. In the stretched state, the plurality of protrusions 12 are spaced apart from each other along the first direction x at a constant first contracted interval d1x and are spaced apart from each other along a second direction y at a constant second contracted interval d1y. The plurality of light emitting devices 100 include a plurality of fixed light emitting devices 20 which are each attached to the upper surfaces of the plurality of protrusions 12 and a plurality of moving light emitting devices 30 which are each positioned between the plurality of protrusions 12. Further, the moving light emitting device 30 may include a first moving light emitting device 31 positioned on the plane part 11 and a second moving light emitting device 32 positioned between the first moving light emitting device 31 and the fixed light emitting device 20.

As illustrated in FIGS. 16 and 17, in the elongated state, the plurality of protrusions 12 are spaced apart from each other along the first direction x at the constant elongated interval d2x and are spaced apart from each other along the second direction y at the constant elongated interval d2y. Here, the first elongated interval d2x is about three times as large as the first contracted interval d1x. Therefore, the elongation=(d2x−d1x)/d1x×100/2=100%. Both of the first moving light emitting device 31 and the second moving light emitting device 32 are positioned on the plane part 11 elongated along the first direction x and the second direction y. In this case, a portion 13 in which the first light emitting device 31 and the second moving light emitting device 32 are not positioned occurs in the plane part 11. As such, the stretchable display device may be elongated in any one direction and in two intersecting directions on the plane.

Meanwhile, according to the exemplary embodiment in FIGS. 1-17, the protrusion 12 is formed on the stretchable substrate 10, and the fixed light emitting device 20 is attached to the protrusion 12. However, embodiments are not limited thereto, e.g., the protrusion 12 is not formed on the stretchable substrate and the fixed light emitting device 20 is attached to a flat surface of the stretchable substrate.

Hereinafter, a stretchable display device according to another exemplary embodiment of the present disclosure will be described in detail with reference to FIGS. 18 to 20.

Figure 18:
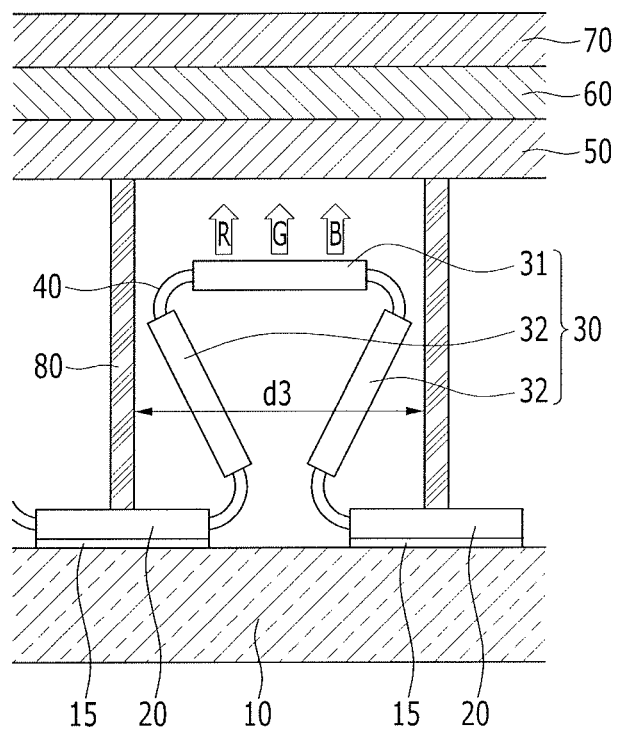
FIG. 18 illustrates a cross-sectional view of a stretchable display according to another exemplary embodiment of the present disclosure.
Figure 19:
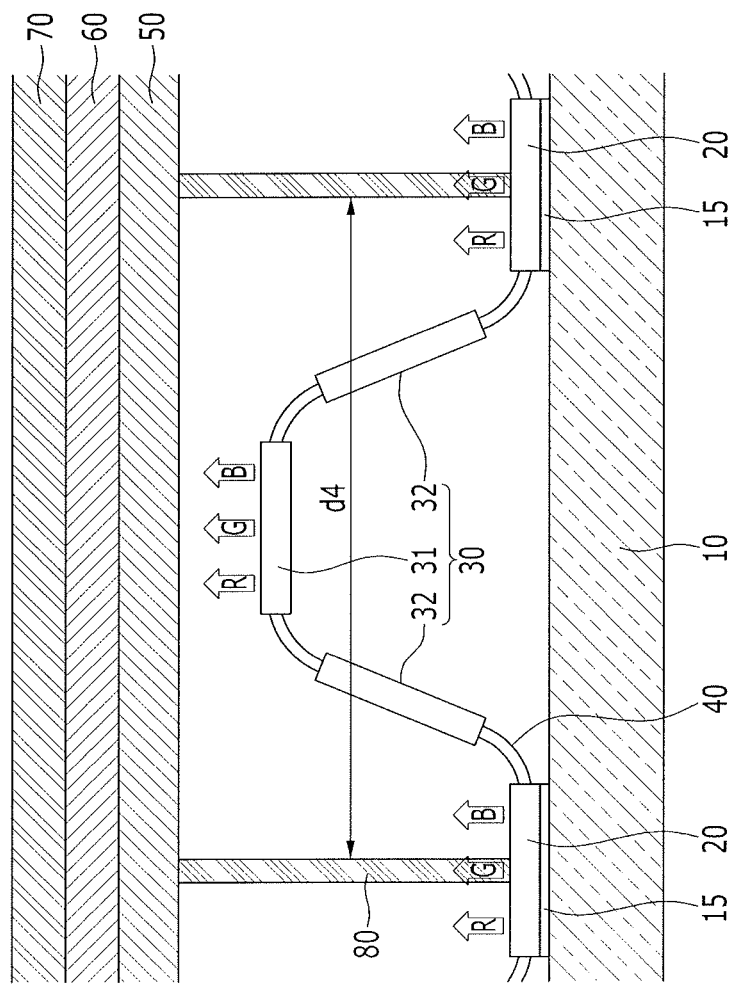
FIG. 19 illustrates a cross-sectional view of the state in which the stretchable display device of FIG. 18 is elongated at an elongation of 100%.
Figure 20:
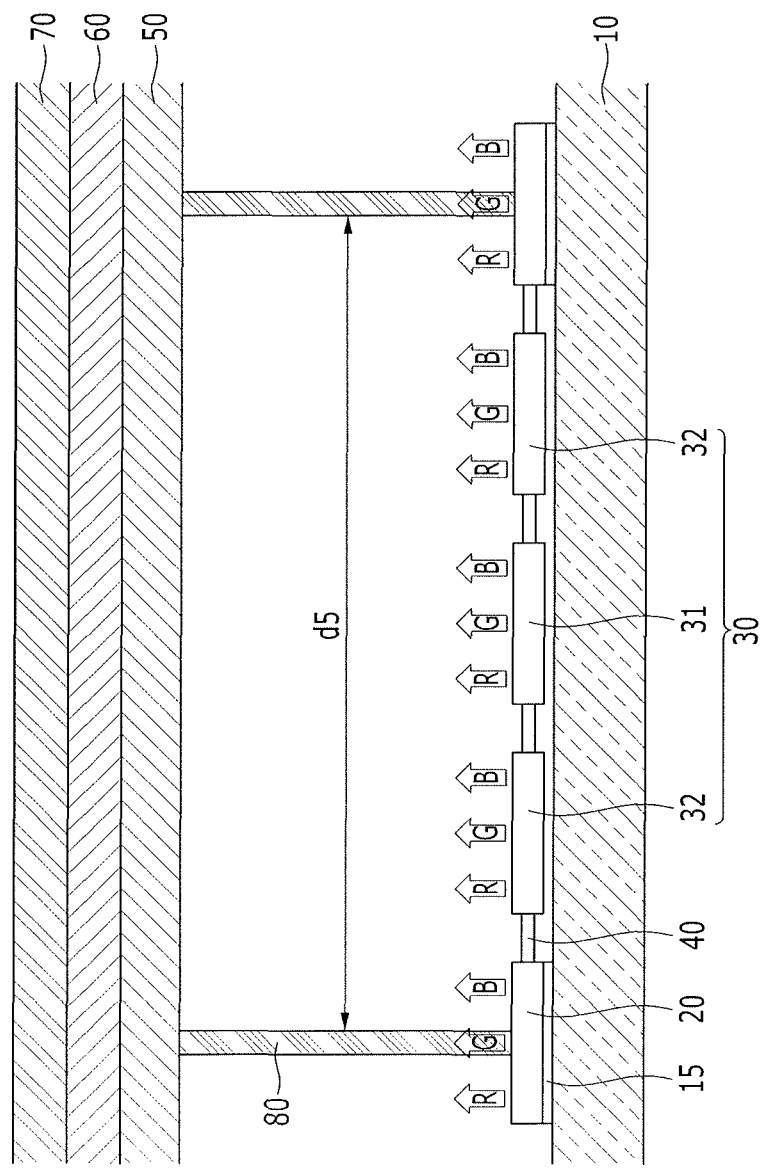
FIG. 20 illustrates a cross-sectional view of the state in which the stretchable display of FIG. 18 is elongated at an elongation of 300%.

FIG. 18 illustrates a cross-sectional view of a stretchable display according to another exemplary embodiment of the present disclosure, FIG. 19 is a cross-sectional view of the state in which the stretchable display device of FIG. 18 is elongated at an elongation of 100%, and FIG. 20 is a cross-sectional view of the state in which the stretchable display of FIG. 18 is elongated at an elongation of 300%. The exemplary embodiment in FIGS. 18 to 20 is substantially the same as the exemplary embodiment in FIGS. 1-3, except that the protrusions 12 are eliminated and all the fixed light emitting devices are attached to flat surfaces of the stretchable substrate, and therefore a detailed repeated description thereof will be omitted.

Referring to FIGS. 18 to 20, the stretchable display according to another exemplary embodiment of the present disclosure includes the stretchable substrate 10, the plurality of light emitting devices 100 positioned on the stretchable substrate 10, and the connection wirings 40 connecting between the plurality of light emitting devices 100. The stretchable substrate 10 may have a, e.g., completely, flat upper surface, i.e., without protrusions.

The plurality of light emitting devices 100 include the plurality of fixed light emitting devices 20 which are attached to the flat surface of the stretchable substrate, i.e., to the plane part 11, and the plurality of moving light emitting devices 30 which are positioned between the fixed light emitting devices 20, while being spaced apart from the upper surface of the stretchable substrate 10. For example, as illustrated in FIGS. 18-20, the fixed light emitting devices 20 may be attached directly onto the upper surface of the stretchable substrate 10, and the plurality of the moving light emitting devices 30 may be held by the connection wiring 40 above the upper surface of the stretchable substrate 10.

The adhesive layer 15 is formed between the plurality of fixed light emitting devices 20 and the stretchable substrate 10. When the stretchable substrate 10 is stretched, the adhesive layer 15 bonds the fixed light emitting device 20 to the stretchable substrate 10 so that the fixed light emitting device 20 is fixed to the stretchable substrate 10.

The plurality of moving light emitting devices 30 may include the first moving light emitting device 31 and the second moving light emitting device 32 positioned between the first moving light emitting device 31 and the fixed light emitting device 20. The first moving light emitting device 31 is horizontally positioned in the contracted state and the second moving light emitting device 32 is angled with respect to the stretchable substrate 10 in the contracted state (FIG. 18). As such, the first moving light emitting device 31 and the second moving light emitting device 32 float, while being spaced apart from the stretchable substrate 10, and while being still connected to each other by the connection wiring 40. Thus, the positions thereof are maintained.

The stretchable cover plate 50 is positioned on the plurality of fixed light emitting devices 20 and the plurality of moving light emitting devices 30. The stretchable cover plate 50 covers the plurality of fixed light emitting devices 20 and the plurality of moving light emitting devices 30 to protect the fixed light emitting devices 20 and the moving light emitting devices 30 from the outside.

Further, a plurality of spacers 80 are positioned between the plurality of fixed light emitting devices 20 and the stretchable cover plate 50 to maintain the interval between the fixed light emitting device 20 and the stretchable cover plate 50. The plurality of spacers 80 are spaced apart from each other at a constantly contracted interval d3.

The stretchable cover plate 50 is connected to the fixed light emitting device 20 and the stretchable substrate 10 through the spacer 80. Therefore, in order to prevent the fixed light emitting device 20 and the stretchable substrate 10 from being damaged in the elongated state, the elongation of the stretchable cover plate 50 may be the same as that of the stretchable substrate 10.

The stretchable touch panel 60 is formed on the stretchable cover plate 50, and the stretchable window 70 is formed on the stretchable touch panel 60. The elongation of the stretchable touch panel 60 and the stretchable window 70 may be equal to that of the stretchable substrate 10.

Hereinafter, an operation of the stretchable display device according to another exemplary embodiment of the present disclosure will be described in detail with reference to FIGS. 18 to 20.

As illustrated in FIG. 18, the spacers 80 which are adjacent to the stretchable substrate 10 in the contracted state are spaced apart from each other, by the contracted interval d3. In this case, the fixed light emitting device 20 is horizontally positioned, while being fixed on the stretchable substrate 20. Since no structure for blocking light emitted from the fixed light emitting device 20 is present over the fixed light emitting device 20, the light emitted from the fixed light emitting device 20 is propagated toward the front side. Further, the first moving light emitting device 31 is horizontally positioned in the air, while being spaced apart from the stretchable substrate 10, and since no structure for blocking light emitted from the first moving light emitting device 31 is present over the first moving light emitting device 31, the light emitted from the fixed light emitting device 31 is propagated toward the front side.

However, the second moving light emitting device 32 is inclinedly positioned and the front surface of the second light emitting device faces downwardly inclinedly, and therefore the light emitted from the second moving light emitting device 32 is hardly propagated toward the front side. Therefore, the second moving light emitting device 32 does not emit sufficient light that propagates to the front side in the contracted state of the stretchable substrate 10.

Next, as illustrated in FIG. 19, the stretchable substrate 10 is elongated, so an elongated interval d4 between the spacers 80 in the elongated state in which the elongation is 100% is larger than the contracted interval d3 between the spacers 80 of the stretchable substrate 10 in the contracted state. Here, the elongation is defined as ½ of an increasing rate of a distance between the spacers 80, and the elongated interval d4 is about three times as large as the contracted interval d3, and therefore, the elongation=(d2−d1)/d3×100/2=100%.

In this case, the fixed light emitting device 20 is horizontally positioned, while being fixed on the stretchable substrate 10, and therefore, the light emitted from the fixed light emitting device 20 is propagated to the front side. Further, in the elongated state, the first moving light emitting device 31 moves vertically, while being spaced apart from the plane part 11 by a tensile force. Even in this case, the first moving light emitting device 31 is horizontally positioned and therefore the light emitted from the first moving light emitting device 31 is propagated toward the front side.

However, since the front surface of the second moving light emitting device 32 faces upwardly inclinedly by the tensile force, even in this case, the light emitted from the second moving light emitting device 32 is still hardly propagated toward the front side. Therefore, the second moving light emitting device 32 does not emit sufficient light to the front side in the contracted state in which the elongation is 100%.

Next, as illustrated in FIG. 20, an elongated interval d5 between the spacers 80 of the stretchable substrate 10 in the elongated state in which the elongation is 300% is larger than the elongated interval d4 between the spacers 80 of the stretchable substrate 10 in the stretched state in which the elongation is 100%. Here, the elongation is defined as ½ of an increasing rate of a distance between the spacers 80, and the elongated interval d5 is about seven times as large as the contracted interval d3, and therefore, the elongation=(d5−d3)/d3×100/2=300%.

In this case, the fixed light emitting device 20 still emits light to the front side. The first moving light emitting device 31 moves vertically downwardly by the tensile force to contact the upper surface of the stretchable substrate 10, and therefore, is horizontally positioned on the stretchable substrate 10 to emit light that propagates to the front side. Further, the second moving light emitting device 32 also moves downwardly by the tensile force to contact the upper surface of the stretchable substrate 10, and thus, is also horizontally positioned to emit light that propagates to the front side. Therefore, the second moving light emitting device 32 emits light in the elongated state in which the elongation is 300%.

As such, when the elongation is increased and the stretchable substrate 10 is elongated, the number of light emitting devices 100 which emits light is increased, and therefore, even when the stretchable substrate 10 is elongated, the resolution does not deteriorate. Further, it is possible to make the resolution uniform overall by increasing the number of light emitting devices which emit light depending on the elongation.

Meanwhile, according to the exemplary embodiment of the present disclosure illustrated in FIGS. 18 to 20, some of the moving light emitting devices emit light toward the front side in a contracted state. However, embodiments are not limited thereto, e.g., none of the moving light emitting devices may emit light sufficient light toward the front side in the contracted state.

Hereinafter, a stretchable display device according to another exemplary embodiment will be described in detail with reference to FIGS. 21 and 22.

Figure 21:
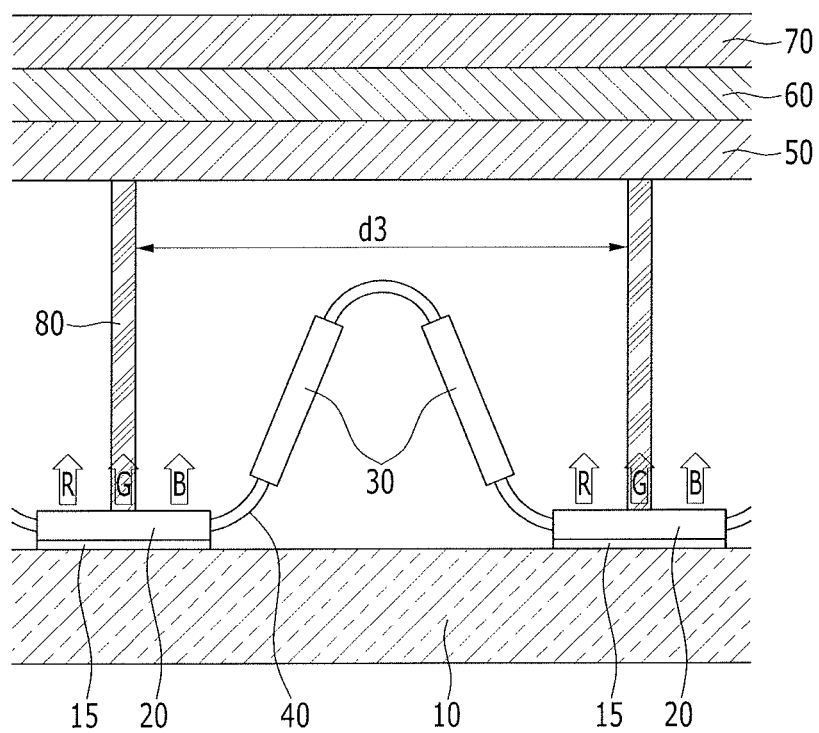
FIG. 21 illustrates a cross-sectional view of a stretchable display according to another exemplary embodiment of the present disclosure.
Figure 22:
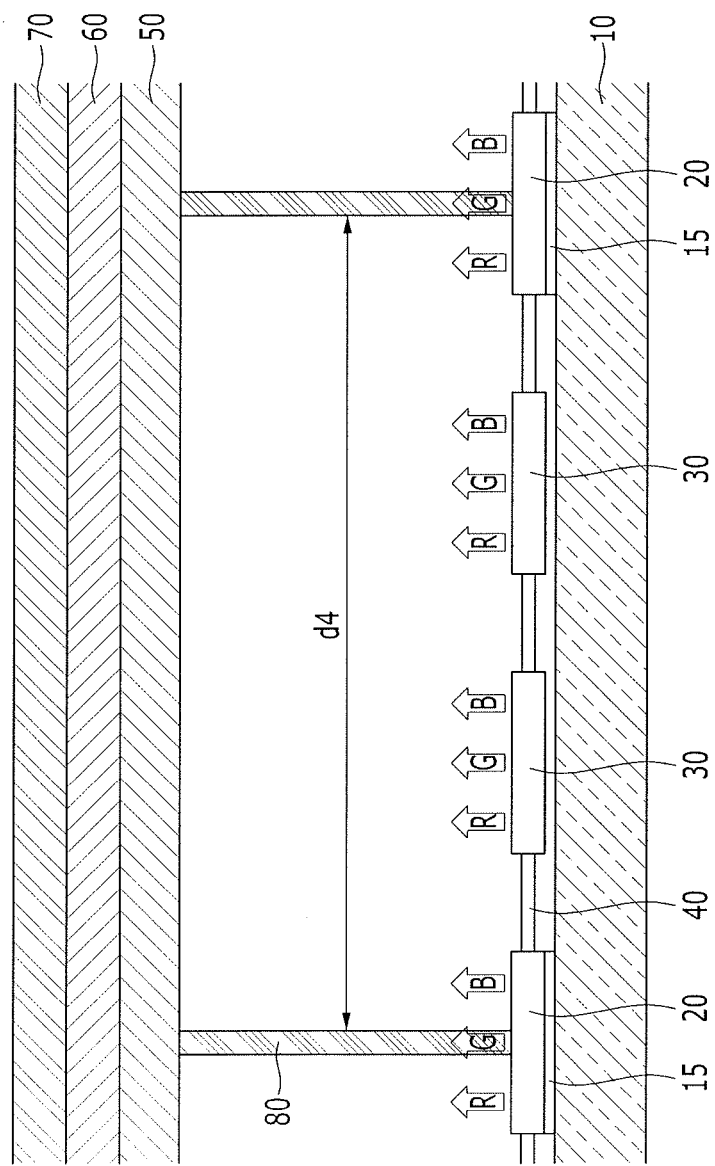
FIG. 22 illustrates a cross-sectional view of the state in which the stretchable display device of FIG. 21 is elongated at an elongation of 50%.

FIG. 21 illustrates a cross-sectional view of a stretchable display according to another exemplary embodiment of the present disclosure, and FIG. 22 is a cross-sectional view of the state in which the stretchable display device of FIG. 21 is elongated at an elongation of 50%. The exemplary embodiment in FIGS. 21 and 22 is substantially the same as the exemplary embodiment in FIGS. 18 and 20, except that all the moving light emitting devices emit light in the contracted state, and therefore a detailed repeated description thereof will be omitted.

As illustrated in FIGS. 21 and 22, the plurality of moving light emitting devices 30 of the stretchable display device according to another exemplary embodiment of the present disclosure are positioned between the fixed light emitting devices 20 which are attached to the stretchable substrate 20. The spacers 80 which are adjacent to each other in the contracted state are spaced apart from each other, having the contracted interval d3. In this case, the fixed light emitting device 20 is horizontally positioned while being fixed on the stretchable substrate 10 and, therefore, emits light toward the front side. Further, all the moving light emitting devices 30 are inclinedly positioned in the air, being spaced apart from the stretchable substrate 10 and, therefore, light emitted from the moving light emitting device 30 is hardly propagated toward the front side. Therefore, the moving light emitting devices 30 do not emit sufficient light toward the front side in the contracted state of the stretchable substrate 10.

Next, as illustrated in FIG. 22, the stretchable substrate 10, such that the elongated interval d4 between the spacers 80 in the elongated state in which the elongation is 50% is larger than the contracted interval d3 between the spacers 80 in the contracted state. Here, the elongation is defined as ½ of an increasing rate of a distance between the spacers 80 and the elongated interval d4 is about two times as large as the contracted interval d3. Therefore, the elongation=(d4−d3)/d3×100/2=50%.

In this case, the fixed light emitting device 20 is still horizontally positioned and, therefore, emits light toward the front side. Further, the moving light emitting device 30 which is inclinedly positioned moves downwardly by the tensile force and, thus, is horizontally positioned on the stretchable substrate 10 and therefore emits light toward the front side.

By way of summation and review, a conventional stretchable display has a flexible panel with a hidden portion, so the hidden portion may be stretched, e.g., expanded, if necessary, to be revealed to a user. However, since the conventional display device is not actually stretched but only reveals a hidden portion, an entire thickness of the display device may be too thick.

Further, the conventional stretchable display device includes a light emitting diode (LED) emission unit and a flexible connection part that requires to individually transfer a plurality of LEDs. However, in view of this configuration, it is difficult for the stretchable display to have a large area and high resolution, but instead has a low resolution since the connection part occupies a considerable area and further deteriorates the resolution at the time of being stretched. Further, when the existing stretchable display is implemented on a curved surface, an elongation of the stretchable display is changed depending on a position on the curved surface and thus the resolution is changed at each position.

In contrast, according to an exemplary embodiment, it is possible to increase the number of light emitting devices which emit light in a stretched state by attaching fixed light emitting devices to an upper surface of a stretchable substrate, e.g., to a protrusion, and positioning moving light emitting devices between the fixed light emitting devices, e.g., between the protrusions. Therefore, even though the stretchable substrate is stretched, the resolution does not deteriorate.

Further, it is possible to make the resolution uniform overall by increasing the number of light emitting devices which emit light depending on the elongation. That is, it is possible to make the resolution uniform even on a curved surface having a large curvature on the whole by increasing the number of light emitting devices which emit light at a portion having the largest elongation on the curved surface and reducing the number of light emitting devices which emits light at the portion having the smallest elongation on the curved surface.

Further, it is possible to increase the number of light emitting devices in an elongated state of the stretchable substrate by attaching the fixed light emitting device to the surface of the stretchable substrate and positioning the moving light emitting device between the fixed light emitting devices using the connection wiring. Therefore, even though the stretchable substrate is elongated, the resolution does not deteriorate.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A stretchable display, comprising:
a stretchable substrate including a flat part and a plurality of protrusions protruding above the flat part;
a plurality of fixed light emitting devices, each fixed light emitting device being attached to an upper surface of a corresponding protrusion of the plurality of protrusions;
a plurality of moving light emitting devices, the moving light emitting devices being positioned among the plurality of protrusions; and
a plurality of connection wirings connecting among the plurality of fixed light emitting devices and the plurality of moving light emitting devices.

2. The stretchable display as claimed in claim 1, wherein the moving light emitting devices include first moving light emitting devices positioned on the flat part and second moving light emitting devices positioned between respective first moving light emitting devices and fixed light emitting devices.

3. The stretchable display as claimed in claim 2, wherein lateral sides of each protrusion are positively tapered toward an upper surface of the flat part.

4. The stretchable display of claim 3, wherein the second moving light emitting device emits light only in a state in which the stretchable substrate is elongated.

5. The stretchable display as claimed in claim 2, wherein lateral sides of the protrusion are reversely tapered toward an upper surface of the flat part, the second moving light emitting devices extending along respective lateral sides of the protrusions.

6. The stretchable display as claimed in claim 5, wherein the first moving light emitting device and the second moving light emitting device are horizontal only when the stretchable substrate is elongated.

7. The stretchable display as claimed in claim 1, wherein the moving light emitting devices emit light when the stretchable substrate is contracted.

8. The stretchable display as claimed in claim 1, further comprising an adhesive layer between the protrusions and the fixed light emitting devices.

9. The stretchable display as claimed in claim 1, wherein each of the fixed light emitting devices and the moving light emitting devices includes a support layer, a display layer on the support layer, and an encapsulating layer covering the display layer.

10. The stretchable display as claimed in claim 1, wherein the connection wiring includes a metal line and a flexible polymer enclosing the metal line.

11. The stretchable display as claimed in claim 1, wherein the stretchable substrate is stretchable in a first direction.

12. The stretchable display as claimed in claim 1, wherein the stretchable substrate is simultaneously stretchable in a first direction and in a second direction orthogonal to the first direction.

13. The stretchable display as claimed in claim 1, further comprising:
a stretchable cover plate positioned on the fixed light emitting device;
a stretchable touch panel on the stretchable cover plate; and
a stretchable window on the stretchable touch panel.

14. A stretchable display, comprising:
a stretchable substrate;
a plurality of fixed light emitting devices attached to the stretchable substrate;

a plurality of moving light emitting devices positioned over the stretchable substrate, while being spaced apart from the stretchable substrate; and a plurality of connection wirings connecting the plurality of fixed light emitting devices and the plurality of moving light emitting devices.

15. The stretchable display as claimed in claim 14, wherein at least one of the plurality of moving light emitting devices does not emit light when the stretchable substrate is contracted.

16. The stretchable display as claimed in claim 14, further comprising:
- a stretchable cover plate over the fixed light emitting device and the moving light emitting device;
- a spacer positioned between each of the fixed light emitting devices and the stretchable cover plate, the spacer maintaining an interval between the fixed light emitting device and the stretchable cover plate;
- a stretchable touch panel on the stretchable cover plate; and
- a stretchable window on the stretchable touch panel.

17. The stretchable display as claimed in claim 14, further comprising an adhesive layer between the stretchable substrate and the fixed light emitting device.

18. A manufacturing method of a stretchable substrate, the method comprising:
- forming a plurality of light emitting devices and a plurality of connection wirings connecting therebetween on a carrier substrate;
- separating the plurality of light emitting devices and the plurality of connection wirings from the carrier substrate;
- forming a stretchable substrate including a plurality of protrusions protruding above a flat part of the stretchable substrate;
- elongating the stretchable substrate to increase intervals among the plurality of protrusions;
- attaching the plurality of light emitting devices and the plurality of connection wirings to the elongated stretchable substrate; and
- contracting the stretchable substrate.

19. The method as claimed in claim 18, wherein forming the plurality of light emitting devices includes:
- attaching a plurality of fixed light emitting devices to the protrusions; and
- forming a plurality of moving light emitting devices between the protrusions.

20. The method as claimed in claim 18, further comprising:
- positioning a stretchable cover plate above the light emitting devices when the stretchable substrate is in contracted state;
- forming a stretchable touch panel on the stretchable cover plate; and
- forming a stretchable window on the stretchable touch panel.

* * * * *